(12) United States Patent
Kumakura

(10) Patent No.: US 6,760,969 B2
(45) Date of Patent: Jul. 13, 2004

(54) METHOD FOR CONNECTING ELECTRICAL COMPONENTS

(75) Inventor: Hiroyuki Kumakura, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/992,031

(22) Filed: Nov. 26, 2001

(65) Prior Publication Data

US 2002/0060092 A1 May 23, 2002

Related U.S. Application Data

(62) Division of application No. 09/603,840, filed on Jun. 26, 2000, now abandoned.

(30) Foreign Application Priority Data

Jul. 21, 1999 (JP) .......................................... 11-206581

(51) Int. Cl.[7] .................................................. H05K 3/30
(52) U.S. Cl. ............................. 29/832; 29/739; 29/740; 174/88 R; 361/784
(58) Field of Search ........................ 29/739, 740, 868, 29/832; 361/784; 174/84 R, 88 R, 94 R

(56) References Cited

U.S. PATENT DOCUMENTS

| | | |
|---|---|---|
| 4,735,847 A | 4/1988 | Fujiwara et al. |
| 4,740,657 A * | 4/1988 | Tsukagoshi et al. ...... 174/88 R |
| 5,328,087 A | 7/1994 | Nelson et al. |
| 5,546,279 A | 8/1996 | Aota et al. |
| 5,627,730 A | 5/1997 | Konig et al. |
| 5,652,055 A | 7/1997 | King et al. |
| 5,714,252 A | 2/1998 | Hogerton et al. |
| 5,843,251 A | 12/1998 | Tsukagoshi et al. |
| 5,903,056 A | 5/1999 | Canning et al. |
| 5,965,064 A | 10/1999 | Yamada et al. |
| 6,034,331 A | 3/2000 | Tsukagoshi et al. |
| 6,042,894 A | 3/2000 | Goto et al. |
| 6,189,208 B1 | 2/2001 | Estes et al. |

OTHER PUBLICATIONS

Adhesion Society of Japan, Adhesion Handbook (3rd Edition), Nikkan Kogyo Shimbun, Ltd., Jun. 28, 1996, 1385–1390.

* cited by examiner

Primary Examiner—Richard K. Chang
(74) Attorney, Agent, or Firm—Oliff & Berridge, PLC

(57) ABSTRACT

A method for connecting electrical components is provided. The method includes electrically connecting electrodes on two separate substrates with an anisotropic electroconductive adhesive layer. The thickness of the electroconductive adhesive layer prior to connection (X) is given by:

$$0.5 \times \{(A^1 C^1 + A^2 C^2)/(B+C)\} \leq X \leq 2 \times \{(A^1 C^1 + A^2 C^2)/(B+C)\}$$

where: $A^1$ is a height of electrodes on a first substrate, $B^1$ is a width of the electrodes on the first substrate and $C^1$ is a width of an interelectrode space between the electrodes on the first substrate; $A^2$ is a height of electrodes on a second substrate, $B^2$ is a width of the electrodes on the second substrate and $C^2$ is a width of an interelectrode space between the electrodes on the second substrate; and $B+C=B^1+C^1=B^2+C^2$.

1 Claim, 3 Drawing Sheets

METHOD FOR CONNECTING ELECTRICAL COMPONENTS

This is a Division of application Ser. No. 09/603,840 filed Jun. 26, 2000 now abandoned. The entire disclosure of the prior application(s) is hereby incorporated by reference herein in its entirety.

BACKGROUND OF THE INVENTION

1. Field of the Invention

The present invention relates to a connection structure formed between two electronic components such as a liquid-crystal panel and a film connector.

2. Description of the Related Art

A film connector such as the one depicted in FIGS. 4A and 4B (where FIG. 4A is a fragmentary cutaway plane view, and FIG. 4B is a cross section along Y—Y in FIG. 4A) may be used to electrically connect the connection terminals of a liquid-crystal panel with the connection terminals on a motherboard. This film connector is configured such that conductor layers 42 in the form of patterned copper foil are formed on a film substrate 41 composed of polyester or another flexible resin, and a cover film 43 is laid over the conductor layers 42. In this structure, the cover film 43 is configured such that the conductor layers 42 remain exposed at the two ends of the flexible resin film substrate 41. Anisotropic electroconductive adhesive layers 44a and 44b are formed to the same layer thickness in the areas of the conductor layers 42 not covered by the cover film 43.

The height of the conductor layers for the connection terminals of a liquid-crystal panel is commonly 1 μm or less, whereas the height of the conductor layers for the connection terminals of a motherboard is 10 to 50 μm. The result is that when the connection terminals of a liquid-crystal panel and the connection terminals on a motherboard are connected using a film connector in which the anisotropic electroconductive adhesive layers at the two ends are fashioned in the same layer thickness as shown in FIG. 4B, the anisotropic electroconductive adhesive often leaks from the connections on the side of the liquid-crystal panel, creating short circuits. Another drawback is that the connections on the motherboard side acquire relatively high conduction resistance and have inadequate adhesion strength.

Such drawbacks are always present in connection structures used to connect two electronic components by means of an anisotropic electroconductive adhesive.

SUMMARY OF THE INVENTION

An object of the present invention, which is aimed at overcoming the above-described drawbacks of the related art, is to provide a connection structure obtained by connecting two electronic components by means of an anisotropic electroconductive adhesive such that the anisotropic electroconductive adhesive is prevented from leaking, and the structure is provided with connections that have low conduction resistance and adequate adhesion strength.

The inventors perfected the present invention upon discovering that the stated object can be attained by maintaining an optimum relation between factors such as the heights of conductor layers for the connection terminals of the two electronic components to be connected, the widths of the conductor layers, the width of the space between the conductor layers, and the thickness of anisotropic electroconductive adhesive layers.

Specifically, the present invention provides a connection structure comprising first electrodes on a first substrate and second electrodes on a second substrate which are electrically connected each other with an interposed anisotropic electroconductive adhesive layer, wherein this connection structure satisfies Eq. 1 below $$0.5 \times \{(A^1C^1 + A^2C^2)/(B+C)\} \leq X \leq 2 \times \{(A^1C^1 + A^2C^2)/(B+C)\} \quad (1)$$

where $A^1$ is the height of each first electrode, $B^1$ is the electrode width thereof, $C^1$ is the width of the interelectrode space, $A^2$ is the height of each second electrode, $B^2$ is the electrode width thereof, $C^2$ is the width of the interelectrode space $(B+C=B^1+C^1=B^2+C^2)$, and X is the thickness of the electroconductive adhesive layer prior to connection.

The present invention also provides a connection method for electrically connecting first electrodes on a first substrate and second electrodes on a second substrate with an interposed anisotropic electroconductive adhesive layer, wherein this connection method satisfies Eq. 1 below $$0.5 \times \{(A^1C^1 + A^2C^2)/(B+C)\} \leq X \leq 2 \times \{(A^1C^1 + A^2C^2)/(B+C)\} \quad (1)$$

where $A^1$ is the height of each first electrode, $B^1$ is the electrode width thereof, $C^1$ is the width of the interelectrode space, $A^2$ is the height of each second electrode, $B^2$ is the electrode width thereof, $C^2$ is the width of the interelectrode space $(B+C=B^1+C^1=B^2+C^2)$, and X is the thickness of the electroconductive adhesive layer prior to connection.

The present invention also provides a film connector in which conductor layers are formed on a flexible resin film substrate, a cover film is laid over these conductor layers such that the conductor layers are exposed at the two ends of the flexible resin film substrate, and anisotropic electroconductive adhesive layers are formed in the areas of the conductor layers not covered by the cover film, wherein this film connector has a configuration in which the thickness of the anisotropic electroconductive adhesive layers, the height of the conductor layers at the two ends of the flexible resin film substrate, the width of the conductor layers, and the width of the space between the conductor layers are selected such that the electrode height of the components to be connected by means of the film connector, the electrode width, and the width of the interelectrode space satisfy the requirements of the inventive connection method.

Other objects and features of the present invention will be described or become apparent from the following disclosure.

DESCRIPTION OF THE PREFERRED EMBODIMENTS

The connection structure of the present invention will first be described.

Figure 1:
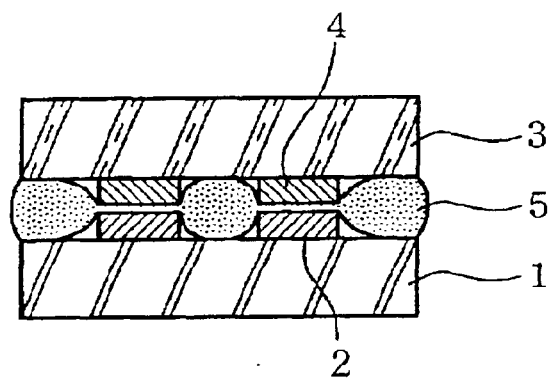
FIG. 1 is a schematic cross-sectional view of the inventive connection structure.
Figure 2:
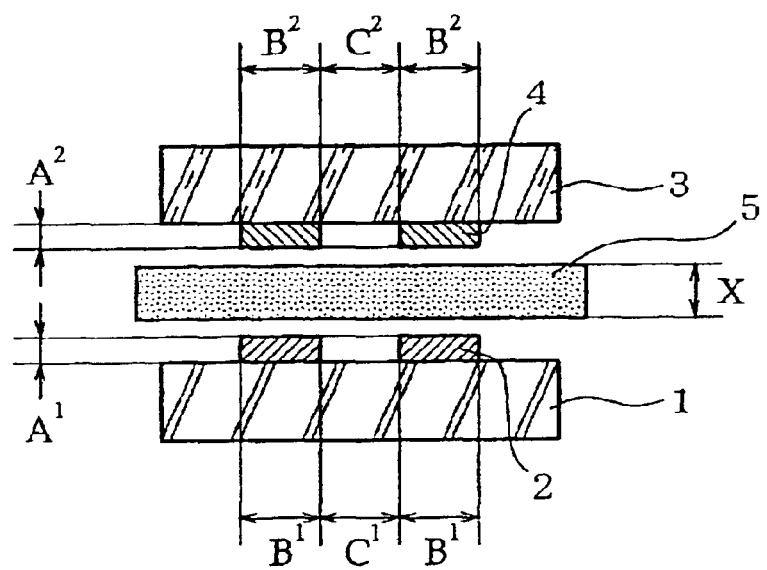
FIG. 2 is a schematic cross-sectional view of the inventive connection structure immediately before connection.

The connection structure of the present invention is one in which first electrodes 2 on a first substrate 1 and second electrodes 4 on a second substrate 3 are electrically connected with an interposed anisotropic electroconductive adhesive layer 5, as shown in FIG. 1. This connection structure must satisfy Eq. 1 below $$0.533\{(A^1C^1+A^2C^2)/(B+C)\} \leq X \leq 2\times\{(A^1C^1+A^2C^2)/(B+C)\} \quad (1)$$

where $A^1$ is the height of each first electrode, $B^1$ is the electrode width thereof, $C^1$ is the width of the interelectrode space, $A^2$ is the height of each second electrode, $B^2$ is the electrode width thereof, $C^2$ is the width of the interelectrode space ($B+C=B^1+C^1=B^2+C^2$), and X is the thickness of the electroconductive adhesive layer 5 prior to connection, as shown in FIG. 2, which depicts the state existing immediately prior to connection. The variables in Eq. 1 are as follows.

| | |
|---|---|
| (B + C): | Width of a connection unit comprising a group of electrodes and an interelectrode space |
| $A^1C^1$: | Cross-sectional surface area of an interelectrode space on the first substrate side of a connection unit (cross-sectional surface area of a space filled with an anisotropic electroconductive adhesive layer on the first substrate side of the connection unit) |
| $A^2C^2$: | Cross-sectional surface area of an interelectrode space on the second substrate side of a connection unit (cross-sectional surface area of a space filled with an anisotropic electroconductive adhesive layer on the second substrate side of the connection unit) |
| $A^1C^1 + A^2C^2$: | Total cross-sectional surface area of an interelectrode space of a connection unit (total cross-sectional surface area of a space filled with an anisotropic electroconductive adhesive layer on the connection unit) |
| $(A^1C^1 + A^2C^2)/(B + C)$: | Average distance between the substrates facing each other across the thickness of a connection unit |

Consequently, Eq. 1 means that the thickness of an anisotropic electroconductive adhesive layer in a connection unit must be between half and twice the average distance between the substrates facing each other across the thickness of the connection unit. Specifically, if the thickness X of an anisotropic electroconductive adhesive layer is less than half the average distance between the substrates facing each other across the thickness of a connection unit $\{0.5\times(A^1C^1+A^2C^2)/(B+C)\}$, the amount of anisotropic electroconductive adhesive will not be enough to span the distance between the substrates, so the conduction resistance of the connection will increase and the adhesion strength thereof will decrease. Conversely, if the thickness X of an anisotropic electroconductive adhesive layer is more than twice the average distance between the substrates facing each other across the thickness of a connection unit $\{2\times(A^1C^1+A^2C^2)/(B+C)\}$, a sufficient amount of anisotropic electroconductive adhesive can be fed between the electrodes and in the interelectrode spaces, resulting in reduced conduction resistance and increased adhesion strength for the connection, but the anisotropic electroconductive adhesive leaking from the connection because the interelectrode spaces are incapable of accommodating the anisotropic electroconductive adhesive layers in their entirety.

Eq. 1 can be converted to Eq. 2.

$$0.5\times(A^1C^1+A^2C^2) \leq X(B+C) \leq 2\times(A^1C^1+A^2+C^2) \quad (2)$$

In Eq. 2, $\{X(B+C)\}$ designates the cross-sectional surface area of an anisotropic electroconductive adhesive layer in a connection unit. In other words, Eq. 2 is obtained by expressing Eq. 1 in terms of the cross-sectional surface area of an anisotropic electroconductive adhesive layer. From Eq. 2, it can be easily deduced that the cross-sectional surface area of an anisotropic electroconductive adhesive layer in a connection unit must be between half and twice the total cross-sectional surface area of the spaces filled with the anisotropic electroconductive adhesive inside the connection unit.

The connection structure of the present invention can be fabricated by a connection method in which first electrodes on a first substrate 1 and second electrodes on a second electrode 3 are electrically connected with an interposed anisotropic electroconductive adhesive layer 5 by performing thermocompression bonding with the aid of a common heat bonder. The connection must satisfy Eq. 1, where $A^1$ is the height of each first electrode, $B^1$ is the electrode width thereof, $C^1$ is the width of the interelectrode space, $A^2$ is the height of each second electrode, $B^2$ is the electrode width thereof, $C^2$ is the width of the interelectrode space ($B+C=B^1+C^1=B^2+C^2$), and X is the thickness of the electroconductive adhesive layer prior to connection.

The anisotropic electroconductive adhesive layers can be fabricated by affixing a known anisotropic electroconductive adhesive film to the first substrate or by employing a method in which a film is formed on the first substrate by the screen printing of a known anisotropic electroconductive adhesive in the form of a paste or liquid.

The connection structure and connection method of the present invention allow known materials to be appropriately selected for the first substrate, first electrodes, second substrate, second electrodes, and anisotropic electroconductive adhesive layers such that the materials, sizes, and shapes of these constituent elements satisfy Eq. 1.

Figure 3A:
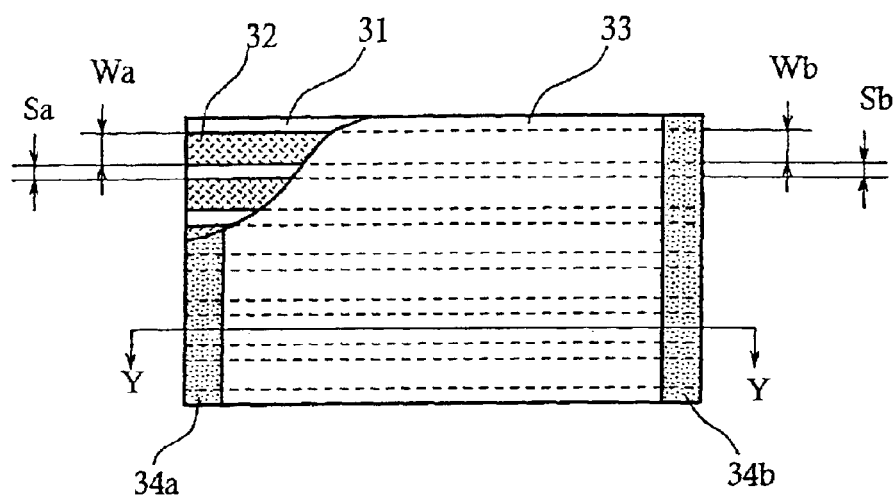
FIGS. 3A and 3B are a fragmentary cutaway plane view and a cross section along Y—Y of the film connector of the present invention, respectively.
Figure 3B:
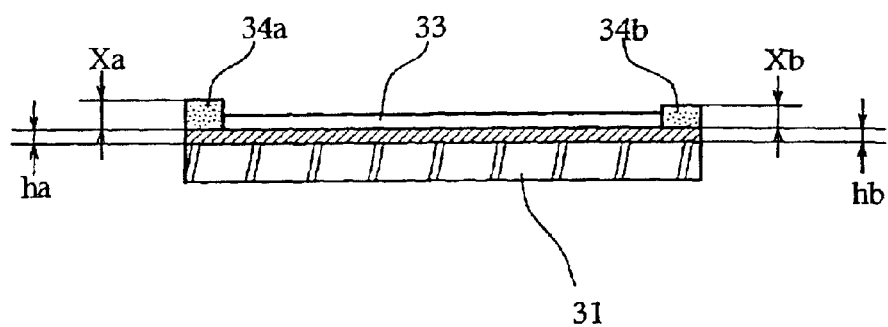
Figure 4:
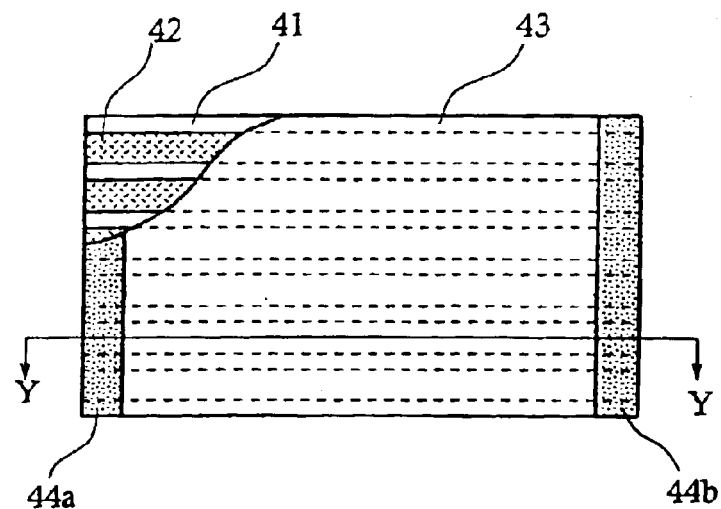
FIGS. 4A and 4B are a fragmentary cutaway plane view and a cross section along Y—Y of a conventional film connector, respectively.
Figure 4:
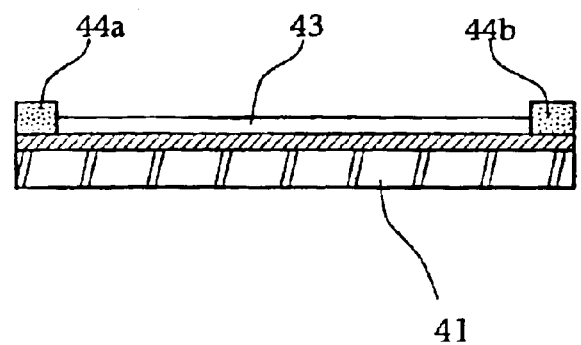

A film connector obtained by electrically connecting the connection terminals of liquid-crystal panels with the connection terminals on a motherboard will be described as an example of an electronic component to which the connection method of the present invention can be applied (see FIG. 3A being a fragmentary cutaway plane view, and FIG. 3B being a cross section along Y—Y in FIG. 3A).

This film connector is configured such that conductor layers 32 in the form of patterned copper foil are formed on a film substrate 31 composed of polyester or another flexible resin, and a cover film 33 is laid over the conductor layers 32. In this structure, the cover film 33 is configured such that the conductor layers 32 remain exposed at the two ends of the flexible resin film substrate 31. Anisotropic electroconductive adhesive layers 34a and 34b are formed in the areas of the conductor layers 32 not covered by the cover film 33. In this film connector, the thicknesses Xa and Xb of the anisotropic electroconductive adhesive layers, the heights ha and hb of the conductor layers at the two ends of the flexible resin film substrate 31, the widths Wa and Wb of the conductor layers, and the widths Sa and Sb of the spaces between the conductor layers are selected such that the electrode widths, the widths of interelectrode spaces, and the electrode heights of the components to be connected by means of the film connector satisfy Eq. 1.

Consequently, the thicknesses Xa and Xb of the anisotropic electroconductive adhesive layers at the two ends of the film connector are often different from each other when mutually different types of components are used on the two sides. In particular, the thickness of one anisotropic electroconductive adhesive layer is often 1.5 or more times greater than the thickness of the other anisotropic electroconductive adhesive layer when a liquid-crystal panel and a motherboard are connected with the aid of a film connector.

EXAMPLES

The present invention will now be described in detail.

Working Examples 1 and 2

Comparative Examples 1 and 2

A flexible printed board ($A^1$=8 μm, $B^1$=150 μm, $C^1$=150 μm) and a rigid board ($A^2$=35 μm, $B^2$=150 μm, $C^2$=150 μm) were thermocompression-bonded as a first substrate 1 and a second substrate 3, respectively, with an interposed epoxy-based anisotropic electroconductive adhesive layer 5 (CP7131, manufactured by Sony Chemical) whose thickness is shown in Table 1, yielding a connection structure, as shown in FIG. 2. In this arrangement, the numerical value of $\{(A^1C^1+A^2C^2)/(B+C)\}$ was 21.5.

The connections of the resulting connection structure were evaluated as described below for their conduction resistance, adhesion strength, and the presence or absence of shorting caused by the leakage of the anisotropic electroconductive adhesive. The results are shown in Table 1.

Conduction Resistance

The conduction resistance of the connection structure was measured immediately after connection (initial resistance) and following aging (60° C., 95% RH, 500 hr). If the post-aging conduction resistance was less than three times the conduction resistance observed immediately after connection, the result was considered satisfactory ("pass"), and if the post-aging resistance was equal to or more than three times the initial resistance, the result was considered unsatisfactory ("fail").

Adhesion strength

A connection (0.2 cm×1 cm) of a freshly connected connection structure was peeled off at 90 degrees with the aid of a peeling apparatus (Tensilon RTC1210, manufactured by Orientech), and the force (gf/cm) needed to initiate such peeling was termed the adhesion strength. An adhesion strength of 400 gf/cm or greater was considered acceptable ("pass"), whereas an adhesion strength below 400 gf/cm was considered unacceptable ("fail").

Shorting

A connection structure was allowed to stand for 500 hr in an atmosphere of 60° C. and 95% RH. Cases in which no shorting had occurred were considered acceptable ("pass"), whereas cases in which shorting had occurred were considered unacceptable ("fail").

TABLE 1

| | Thickness of anisotropic electroconductive adhesive layer (μm) | Conductive resistance | Adhesion strength | Shorting |
| --- | --- | --- | --- | --- |
| Working Example 1 | 12 | Pass | Pass | Pass |
| Working Example 2 | 43 | Pass | Pass | Pass |
| Comparative Example 1 | 10 | Fail | Fail | Pass |
| Comparative Example 2 | 45 | Pass | Pass | Fail |

As can be seen in Table 1, the connection structures of Working Examples 1 and 2, which satisfied Eq. 1, yielded good results on all of the evaluation items.

The connection structure of Comparative Example 1, on the other hand, posed problems in terms of conduction resistance and adhesion strength. (In this example, the thickness of the anisotropic electroconductive adhesive layer was below the lower limit of Eq. 1.) In addition, the connection structure of Comparative Example 2 posed problems in terms of shorting. (In this example, the thickness of the anisotropic electroconductive adhesive layer exceeded the upper limit of Eq. 1.)

Working Examples 3 and 4,

Comparative Examples 3 and 4

A glass board ($A^1$=1 μm, $B^1$=50 μm, $C^1$=40 μm) and a flexible printed board ($A^2$=25 μm, $B^2$=45 μm, $C^2$=45 μm) were thermocompression-bonded as a first substrate 1 and a second substrate 3, respectively, with an interposed epoxy-based anisotropic electroconductive adhesive layer 5 (CP7131, manufactured by Sony Chemical Corp.) whose thickness is shown in Table 2, yielding a connection structure, as shown in FIG. 2. In this arrangement, the numerical value of $\{(A^1C^1+A^2C^2)/(B+C)\}$ was 12.9.

The connections of the resulting connection structure were evaluated in the same manner as in Working Example 1 for their conduction resistance, adhesion strength, and the presence or absence of shorting caused by the leakage of the anisotropic electroconductive adhesive. The results are shown in Table 2.

TABLE 2

| | Thickness of anisotropic electroconductive adhesive layer (μm) | Conductive resistance | Adhesion strength | Shorting |
| --- | --- | --- | --- | --- |
| Working Example 3 | 7 | Pass | Pass | Pass |
| Working Example 4 | 25 | Pass | Pass | Pass |
| Comparative Example 3 | 5 | Fail | Fail | Pass |
| Comparative Example 4 | 27 | Pass | Pass | Fail |

As can be seen in Table 2, the connection structures of Working Examples 3 and 4, which satisfied Eq. 1, yielded good results on all of the evaluation items despite the fact that the numeric value of $\{(A^1C^1+A^2C^2)/(B+C)\}$ was different from that in Working Example 1.

The connection structure of Comparative Example 3, on the other hand, posed problems in terms of conduction resistance and adhesion strength. (In this example, the thickness of the anisotropic electroconductive adhesive layer was below the lower limit of Eq. 1.) In addition, the connection structure of Comparative Example 4 posed problems in terms of shorting. (In this example, the thickness of the anisotropic electroconductive adhesive layer exceeded the upper limit of Eq. 1.)

Working Example 5,
Comparative Examples 5 and 6

A patterned copper foil with a thickness of 12 μm was laminated on a polyimide substrate with a thickness of 25 μm, and a cover coat layer was laminated on the copper foil everywhere except the terminal portions at both ends. The resulting film connector (FC), which is shown in FIG. 3, was used such that one end of the FC was connected to a liquid-crystal display panel (LCDP), and the other terminal of the FC was connected to a motherboard (MB). In this arrangement, the connection on either end of the FC had the configuration of the connection structure shown in FIG. 2.

In the connection structure on the LCDP side, the terminal portion on one side of the FC ($A^1=12$ μm, $B^1=100$ μm, $C^1=100$ μm) and the LCDP terminal portion ($A^2=1$ μm, $B^2=100$ μm, $C^2=100$ μm) were thermocompression-bonded as a first substrate and a second substrate, respectively, with an interposed epoxy-based anisotropic electroconductive adhesive layer (CP7131, manufactured by Sony Chemical Corp.) whose thickness (t1) is shown in Table 3. In this arrangement, the numerical value of $\{(A^1C^1+A^2C^2)/(B+C)\}$ was 6.5.

In the connection structure on the MB side, the terminal portion on the other side of the FC ($A^1=12$ μm, $B^1=150$ μm, $C^1=150$ μm) and the MB terminal portion ($A^2=35$ μm, $B^2=150$ μm, $C^2=150$ μm) were thermocompression-bonded as a first substrate and a second substrate, respectively, with an interposed epoxy-based anisotropic electroconductive adhesive layer (CP7131, manufactured by Sony Chemical) whose thickness (t2) is shown in Table 3. In this arrangement, the numerical value of $\{(A^1C^1+A^2C^2)/(B+C)\}$ was 23.5.

The connections on the resulting connection structures were evaluated in the same manner as in Working Example 1 for their conduction resistance, adhesion strength, and the presence or absence of shorting caused by the leakage of the anisotropic electroconductive adhesive. The results are shown in Table 3.

TABLE 3

| | Thickness of anisotropic electroconductive adhesive layer (μm) | | | Conduction resistance | Adhesion strength | Shorting |
|---|---|---|---|---|---|---|
| | t1 | t2 | t2/t1 | | | |
| Working Example 5 | 12 | 25 | 2.08 | Pass | Pass | Pass |
| Comparative Example 5 | 10 | 10 | 1.0 | Fail (MB side) | Fail (MB side) | Pass |
| Comparative Example 6 | 25 | 35 | 1.4 | Pass | Pass | Fail (LCDP side) |

As can be seen in Table 3, the connection structures of Working Example 5 yielded good results on all of the evaluation items because the thickness (t1=12) of the anisotropic electroconductive adhesive layer and the thickness (t2=25) of the anisotropic electroconductive adhesive layer satisfy Eq. 1 for the numerical value (6.5) of $\{(A^1C^1+A^2C^2)/(B+C)\}$ on the LCDP side and the numerical value (23.5) of $\{(A^1C^1+A^2C^2)/(B+C)\}$ on the MB side, respectively. The corresponding numerical value of t2/t1 was greater than 2.

The connection structure of Comparative Example 5, on the other hand, posed problems in terms of conduction resistance and adhesion strength. (In this example, the thickness (t2=10) of the anisotropic electroconductive adhesive layer was below the range of Eq. 1 for the numerical value (23.5) of $\{(A^1C^1+A^2C^2)/(B+C)\}$ on the MB side.) In addition, the connection structure of Comparative Example 6 posed problems in terms of shorting. (In this example, the thickness (t2=25) of the anisotropic electroconductive adhesive layer was above the range of Eq. 1 for the numerical value (6.5) of $\{(A^1C^1+A^2C^2)/(B+C)\}$ on the LCDP side.).

The present invention prevents an anisotropic electroconductive adhesive from leaking and allows connections having low conduction resistance and adequate bond strength to be obtained in a connection structure in which two electronic components are connected using an anisotropic electroconductive adhesive.

The entire disclosure of the specification, claims, drawings and summary of Japanese Patent Application No. 11-206581 filed Jul. 21, 1999 is hereby incorporated by the reference.

What is claimed is:

1. A connection method, comprising:
   electrically connecting first electrodes on a first substrate and second electrodes on a second substrate with an interposed anisotropic electroconductive adhesive layer, wherein the thickness of the electroconductive adhesive layer prior to connection is given by:

$$0.5\times\{(A^1C^1+A^2C^2)/(B+C)\} \leq X \leq 2\times\{(A^1C^1+A^2C^2)/(B+C)\}$$

where:
   $A^1$ is a height of each first electrode, $B^1$ is an electrode width thereof $C^1$ is a width of an interelectrode space for the first electrodes, $A^2$ is a height of each second electrode, $B^2$ is an electrode width thereof, $C^2$ is a width of an interelectrode space for the second electrodes, provided that $B+C=B^1+C^1=B^2+C^2$, and $X$ is a thickness of the electroconductive adhesive layer prior to connection.

* * * * *